(12) United States Patent
Kawamura

(10) Patent No.: US 7,135,420 B2
(45) Date of Patent: Nov. 14, 2006

(54) SEMICONDUCTOR DEVICE AND MANUFACTURING METHOD THEREOF

(75) Inventor: Hiroe Kawamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/782,770

(22) Filed: Feb. 23, 2004

(65) Prior Publication Data
US 2004/0191973 A1    Sep. 30, 2004

(30) Foreign Application Priority Data
Mar. 25, 2003    (JP)    ............... 2003-083064

(51) Int. Cl.
  *H01L 21/31*    (2006.01)
  *H01L 21/469*    (2006.01)
  *H01L 29/15*    (2006.01)

(52) U.S. Cl. ............... 438/782; 438/149; 438/507; 438/273; 438/285; 438/268; 257/77; 257/80; 257/401; 257/E21.06; 257/E21.054; 257/E21.062; 257/E21.064

(58) Field of Classification Search ............... 438/782, 438/492, 503, 507, 933, 483, 198, 158, 268, 438/149, 99; 257/623, 798, 618, 627, 80, 257/77, 280, E21.054, E21.06, E21.062, 257/E21.064
See application file for complete search history.

(56) References Cited

U.S. PATENT DOCUMENTS

| 4,591,889 A * | 5/1986 | Gossard et al. ............... 257/15 |
| 4,987,094 A * | 1/1991 | Colas et al. ............... 257/185 |
| 5,212,404 A * | 5/1993 | Awano ............... 257/592 |
| 5,436,468 A * | 7/1995 | Nakata et al. ............... 257/15 |
| 5,530,713 A * | 6/1996 | Fukagai ............... 372/45.011 |
| 5,833,749 A * | 11/1998 | Moritani et al. ............ 117/101 |
| 5,886,360 A * | 3/1999 | Ochi ............... 257/15 |
| 5,886,389 A * | 3/1999 | Niwa ............... 257/401 |
| 5,966,625 A * | 10/1999 | Zhong et al. ............... 438/492 |
| 5,977,564 A * | 11/1999 | Kobayashi et al. ............ 257/77 |
| 6,066,571 A * | 5/2000 | Usuda et al. ............... 438/745 |
| 6,645,834 B1 * | 11/2003 | Akiyama ............... 438/459 |

(Continued)

FOREIGN PATENT DOCUMENTS

JP    05-347256    12/1993

(Continued)

OTHER PUBLICATIONS

H. Sayama et al., "Effect of <100> Channel Direction for High Performance SCE Immune pMOSFET with Less Than 0.15 μm Gate Length", IEEE, 1999.

*Primary Examiner*—David A. Zarneke
*Assistant Examiner*—Igwe U. Anya
(74) *Attorney, Agent, or Firm*—Westerman, Hattori, Daniels & Adrian, LLP.

(57) ABSTRACT

Single crystal silicon is grown in a [100] direction to make a bulk. Next, a silicon substrate with a normal of a surface extending in an inclined direction from a [100] direction is cut from the bulk. At this time, when an angle (off-angle) of inclination of the normal is decomposed into a component in a [001] direction and a component in a [010] direction, the component in the [001] direction is made within ±0.2 degrees (excluding 0 degree). An MOS transistor with a moving direction of carriers being the [001] direction is formed on the surface of the silicon substrate. At this time, after steps existing on the surface of the silicon substrate are reconstituted by thermal treatment in a hydrogen atmosphere, a gate insulation film, a gate electrode and the like are formed.

28 Claims, 13 Drawing Sheets

U.S. PATENT DOCUMENTS 6,696,372 B1 * 2/2004 Wang et al. ................... 257/14
2006/0131553 A1 * 6/2006 Yamanaka et al. ............. 257/1

FOREIGN PATENT DOCUMENTS

| JP | 08-264401 | 10/1996 |
| JP | 08-264402 | 10/1996 |
| JP | 08-264780 | 10/1996 |
| JP | 08-321443 | 12/1996 |
| JP | 09-051097 | 2/1997 |
| JP | 10-326790 | 12/1998 |
| JP | 10-335659 | 12/1998 |
| JP | 2002-003295 | 1/2002 |
| JP | 2002-091342 | 3/2002 |
| JP | 2002-151519 | 5/2002 |
| JP | 2004-152965 A | 5/2004 |

* cited by examiner

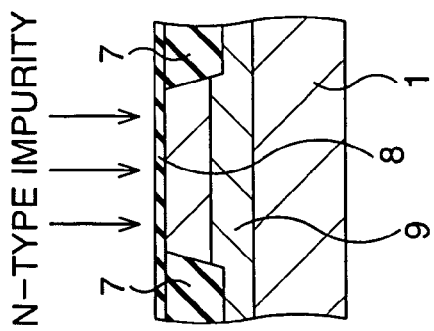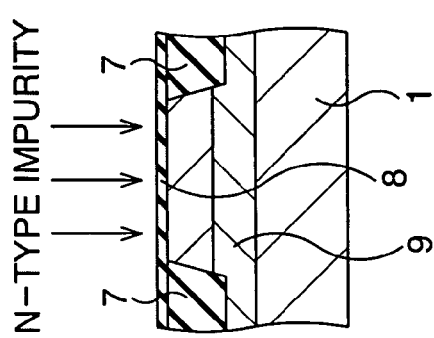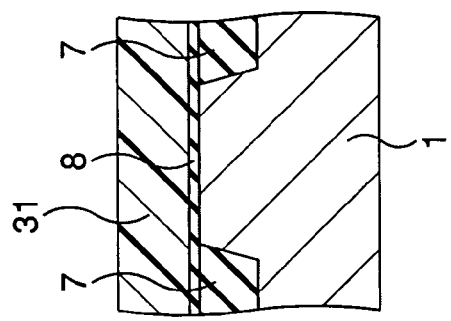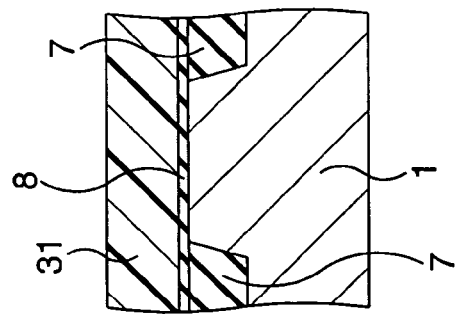

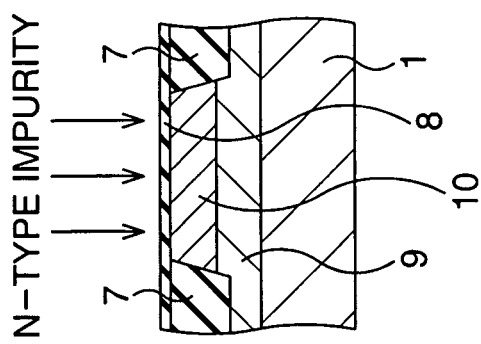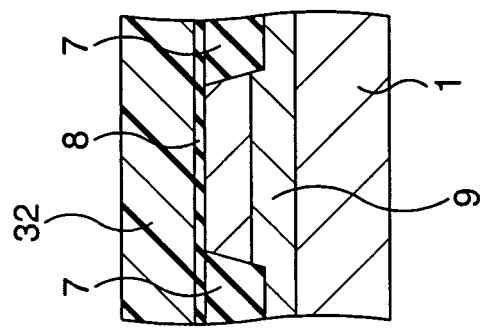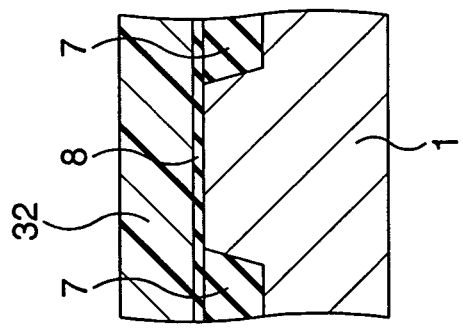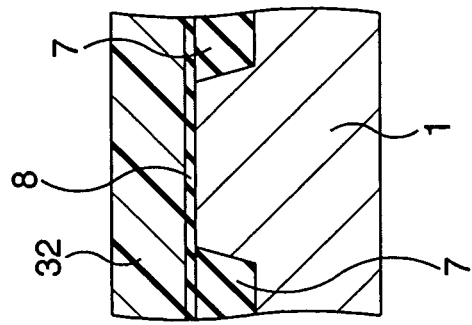

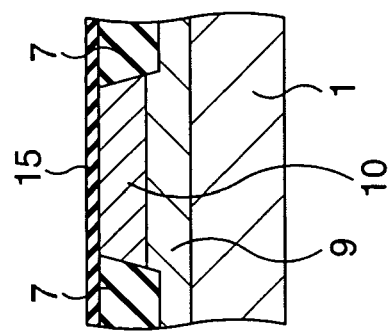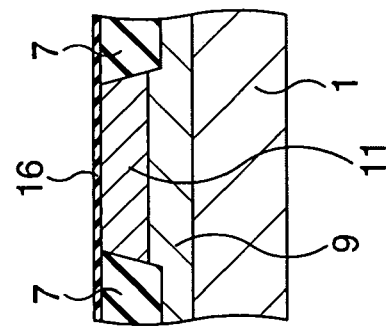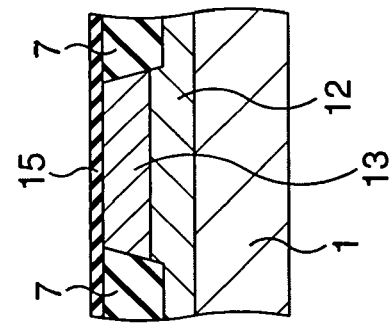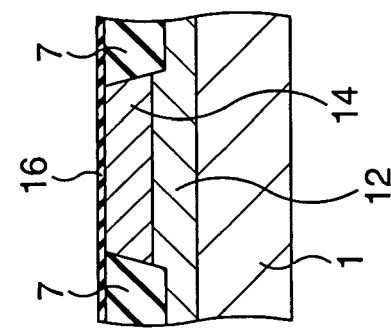

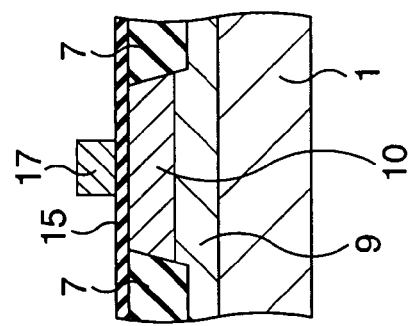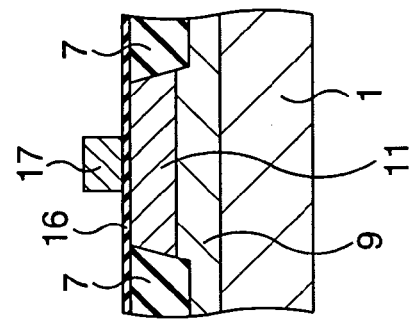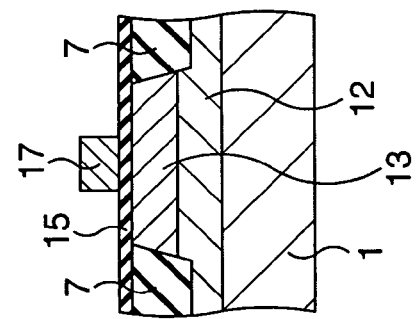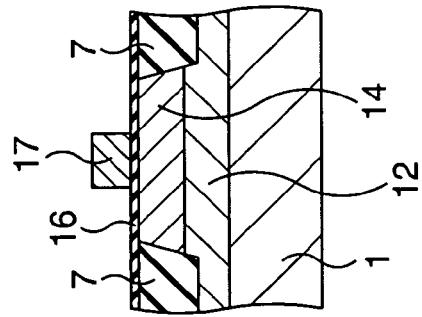

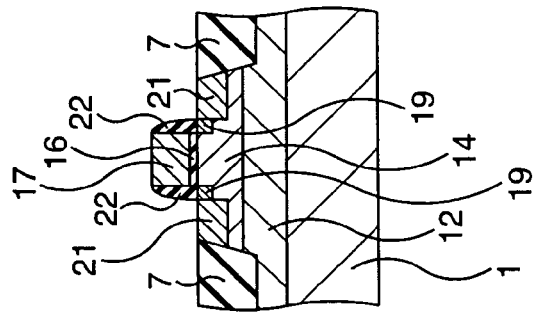
FIG. 12A
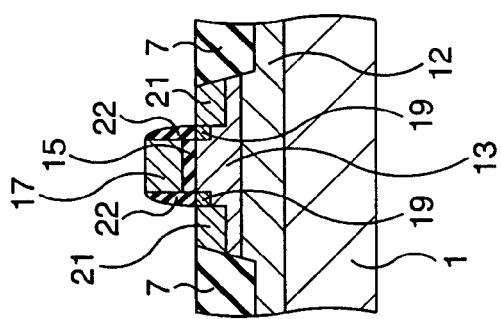
FIG. 12B
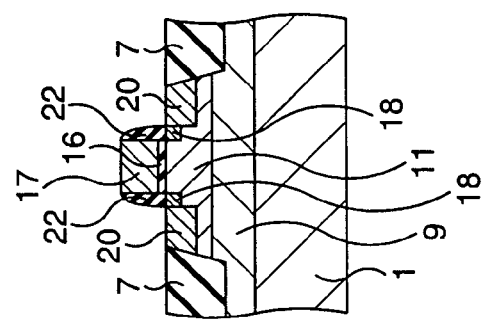
FIG. 12C
FIG. 12D

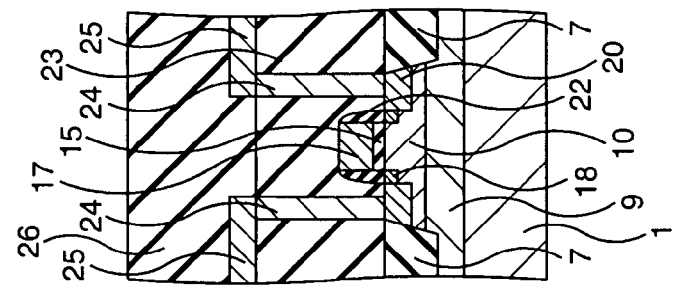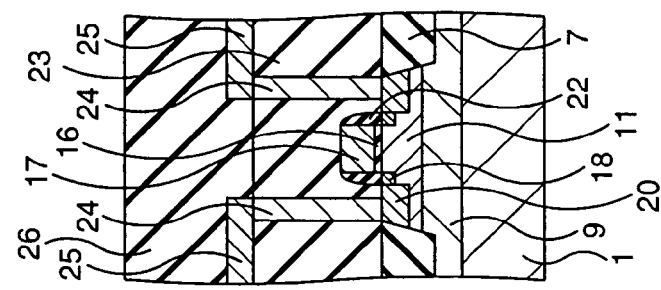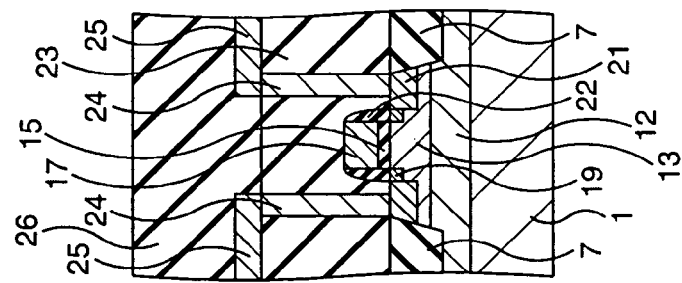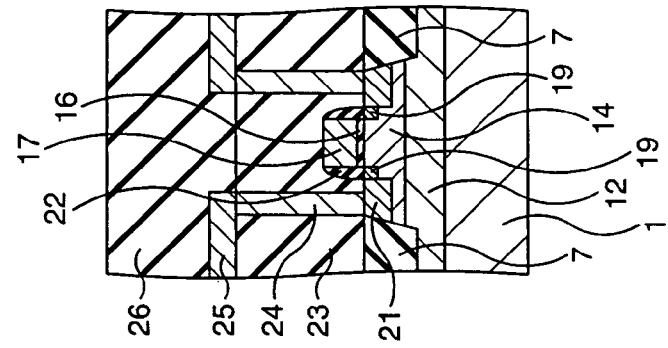

SEMICONDUCTOR DEVICE AND MANUFACTURING METHOD THEREOF

CROSS-REFERENCE TO RELATED APPLICATIONS

This application is based upon and claims the benefit of priority from the prior Japanese Patent Application No. 2003-083064, filed on Mar. 25, 2003, the entire contents of which are incorporated herein by reference.

BACKGROUND OF THE INVENTION

1. Field of the Invention

The present invention relates to a manufacturing method of a semiconductor device preferable for an MOS transistor and the like.

2. Description of the Related Art

In a manufacturing process of silicon substrates and a manufacturing process of semiconductor devices, chemical solution treatment for dissolving surface layers of silicon substrates is generally performed for the purpose of removing particles and removing metal contamination.

Meanwhile, a surface of a silicon substrate is a plane which is intentionally inclined at about 0.2 to 0.5 degrees from a (100) plane. This is for preventing abnormal growth from occurring when an epitaxial layer is grown above the silicon substrate. Inclining a plane orientation of a surface from the (100) plane intentionally like this is sometimes called "giving an off-angle"

CZ (Czochralski) substrates for which epitaxial growth is not performed, and anneal substrates in which high temperature annealing is performed for the CZ substrates are also given the equivalent off-angles for production efficiency. Normally, the off-angle is given from the (100) plane to the <011> direction or the <011-> direction.

In recent years, with an improvement in integration, micronization of a semiconductor element advances, gate length is further being shrunk, and source/drain joint depth is being made shallower. As a result, carriers (electrons and holes) flowing through a channel under a gate electrode are transported in a portion nearer to a surface of a silicon substrate, and become sensitive to roughness of a surface of the silicon substrate. This is because irregularity on the surface causes scattering of the carriers, and carrier mobility is reduced by scattering. Consequently, it is desired that surface roughness in a channel region is low.

However, the roughness of the surface of the silicon substrate becomes high due to the aforementioned chemical solution treatment, and mobility of the carriers is reduced. Thus, in order to improve roughness of the surface of the silicon substrate, it is proposed to perform high temperature annealing in a vacuum, an $H_2$ gas or an Ar gas. Further, to enhance mobility of the carriers, a manufacturing method of making steps existing on a substrate surface extend along a channel length direction is proposed.

Prior arts are disclosed in Patent Document 1 (Japanese Patent Laid-open No. 9-51097), Patent Document 2 (Japanese Patent Laid-open No. 2002-91342), Patent Document 3 (Japanese Patent Laid-open No. 10-326790), Patent Document 4 (Japanese Patent Laid-open No. 10-335659), Patent Document 5 (Japanese Patent Laid-open No. 8-264780), Patent Document 6 (Japanese Patent Laid-open No. 8-264401), Patent Document 7 (Japanese Patent Laid-open No. 8-264402), Patent Document 8 (Japanese Patent Laid-open No. 8-321443), Patent Document 9 (Japanese Patent Laid-open No. 5-347256), Patent Document 10 (Japanese Patent Laid-open No. 2002-151519), Patent Document 11 (Japanese Patent Laid-open No. 2002-3295), and Non-Patent Document 1 (H. Sayama et al., "Effect of <100> Channel Direction for High Performance SCE Immune pMOSFET with Less Than 0.15 μm Gate Length", IEEE, 1999).

However, roughness cannot be sufficiently reduced by any of the methods and structures, and sufficient mobility of the carriers cannot be obtained.

The present invention is made in view of the above problems, and has its object to provide a manufacturing method of a semiconductor device capable of enhancing mobility of carriers by reducing roughness on a surface of a silicon substrate.

SUMMARY OF THE INVENTION

As a result of repeating the earnest examination to solve the aforesaid problems, the inventor of the present application has conceived the embodiments of the invention which will be shown hereinafter.

In a first manufacturing method of a semiconductor device according to the present invention, a silicon substrate with a normal of a surface extending in an inclined direction from a [100] direction is formed. At this time, when an angle of inclination of the normal is decomposed into a component in a [001] direction and a component in a [010] direction, the component in the [001] direction is made within ±0.2 degrees. Next, a semiconductor element with a moving direction of carriers being in the [001] direction is formed on a surface of the silicon substrate. At this time, by performing thermal treatment, steps existing on the surface of the silicon substrate are reconstituted.

In a second manufacturing method of a semiconductor device according to the present invention, a silicon substrate with a normal of a surface extending in an inclined direction from a [100] direction is formed. At this time, when an angle of inclination of the aforesaid normal is decomposed into a component in a [001] direction and a component in a [010] direction, the component in the [001] direction is made within ±0.2 degrees. Next, an epitaxial layer is formed on the silicon substrate. Next, a semiconductor element with a moving direction of carriers being in the [001] direction is formed on a surface of the epitaxial layer. At this time, by performing thermal treatment, steps existing on the surface of the epitaxial layer are reconstituted.

In the present invention, the component in the [001] direction is properly specified when the inclination angle of the normal of the surface of the silicon substrate from the [100] direction is decomposed into the component in the [001] direction and the component in the [010] direction, and the [001] direction is made the moving direction of the carriers in the semiconductor element, thus reducing roughness on the surface of the silicon substrate and enhancing mobility of the carriers.

The [100] direction, the [010] direction and the [001] direction are equivalent in Miller index, and these directions are artificially determined according to the rule of the right-hand system. Accordingly, if what are set as the [100] direction, the [010] direction and the [001] direction in the invention of the present application are artificially set as the [001] direction, the [100] direction and the [010] direction, respectively, they are all the same as in the invention of the present application.

In the specification of the present application, the "bar" constituting the Miller index is expressed by affixing "-" at the end of the numeral which is to be given the "bar". For example, the opposite direction of the [001] direction is expressed as [001-].

BRIEF DESCRIPTION OF THE DRAWINGS

FIG. 6A to FIG. 6D are sectional views showing the manufacturing method of the semiconductor device according to the embodiment of the present invention, continued from FIG. 5A to FIG. 5E;

FIG. 7A to FIG. 7D are sectional views showing the manufacturing method of the semiconductor device according to the embodiment of the present invention, continued from FIG. 6A to FIG. 6D;

FIG. 10A to FIG. 10D are sectional views showing the manufacturing method of the semiconductor device according to the embodiment of the present invention, continued from FIG. 9A to FIG. 9D;

FIG. 11A to FIG. 11D are sectional views showing the manufacturing method of the semiconductor device according to the embodiment of the present invention, continued from FIG. 10A to FIG. 10D;

FIG. 12A to FIG. 12D are sectional views showing the manufacturing method of the semiconductor device according to the embodiment of the present invention, continued from FIG. 11A to FIG. 11D; and FIG. 13A to FIG. 13D are sectional views showing the manufacturing method of the semiconductor device according to the embodiment of the present invention, continued from FIG. 12A to FIG. 12D.

DETAILED DESCRIPTION OF THE PREFERRED EMBODIMENTS

The inventor of the present application conducted the experiment concerning what influence the degree of the off-angle of a silicon substrate (semiconductor substrate) has on roughness of the surface of the silicon. In this experiment, after a bulk of single crystal silicon was produced by growing the single crystal silicon in the [100] direction by the CZ method, single crystal silicon substrates W1, W2 and W3 were cut while giving the off-angles as shown in the following Table 1 with respect to the (100) plane. After each of the single crystal silicon substrates was cleaned, thermal treatment was performed, whereby the steps existing on the surface were reconstituted. However, there is a possibility that an error exists in a range of ±0.03 degrees in the values in Table 1. The values in Table 1 are values obtained when the angle (off-angles) of the inclination of the normal of the surface of each of the silicon substrates was decomposed into the component in the [001] direction and the component in the [010] direction.

TABLE 1

| SUBSTRATE | [001] DIRECTION COMPONENT | [010] DIRECTION COMPONENT |
|---|---|---|
| W1 | 0.01° | −0.02° |
| W2 | 0.14° | 0.02° |
| W3 | 0.38° | −0.03° |

Thereafter, with use of the atomic force microscope, the initial roughness of each of the single crystal silicon substrates was measured. The wave form was analyzed at the wavelengths of 1 μm (1.5 nm pitch) in the [001] direction, and thereby the Power Spectrum Density was obtained. The Power Spectrum Density corresponds to surface roughness. The result is shown in FIG. 1.

Figure 1:
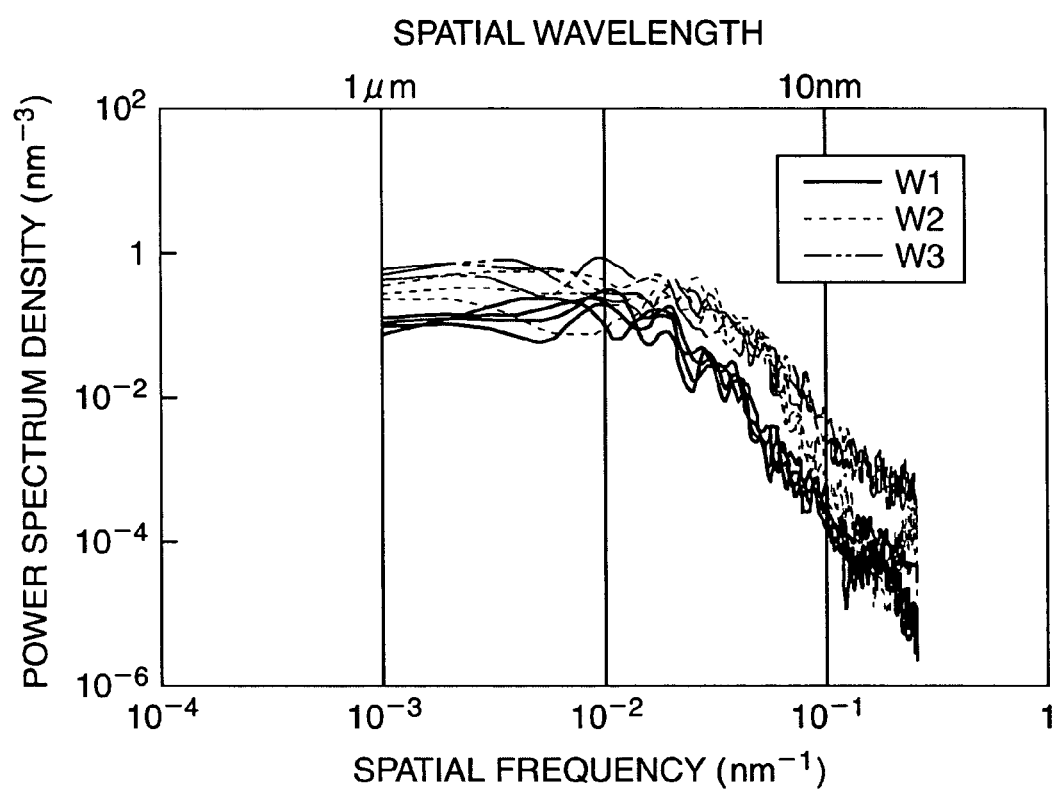
FIG. 1 is a graph showing relationship of spatial frequency and spatial wavelength, and surface roughness.

As shown in FIG. 1, the initial roughness of the silicon substrate W1 was smaller than the initial roughness of the silicon substrate W3 over the spatial wavelength of 10 nm to 1 μm. The initial roughness of the silicon substrate W2 was smaller than the initial roughness of the silicon substrate W3 in the region of the spatial wavelength of 10 nm or less.

Next, the following cycle treatment was performed twice for the silicon substrates W1, W2 and W3.

The cycle treatment: RCA cleaning→formation of a silicon thermal oxide film $S_o$ (thickness; 10 nm)→removal of the silicon oxide film $S_o$ by using HF After carrying out the above-described cycle treatment twice, roughness of each of the single crystal silicon substrates W1, W2 and W3 was measured by using the atomic force microscope. The wave form thereof was analyzed at the wavelengths of 1 μm (1.5 nm pitch) in the [001] direction, and Power Spectrum Density was obtained. The result is shown in FIG. 2.

Figure 2:
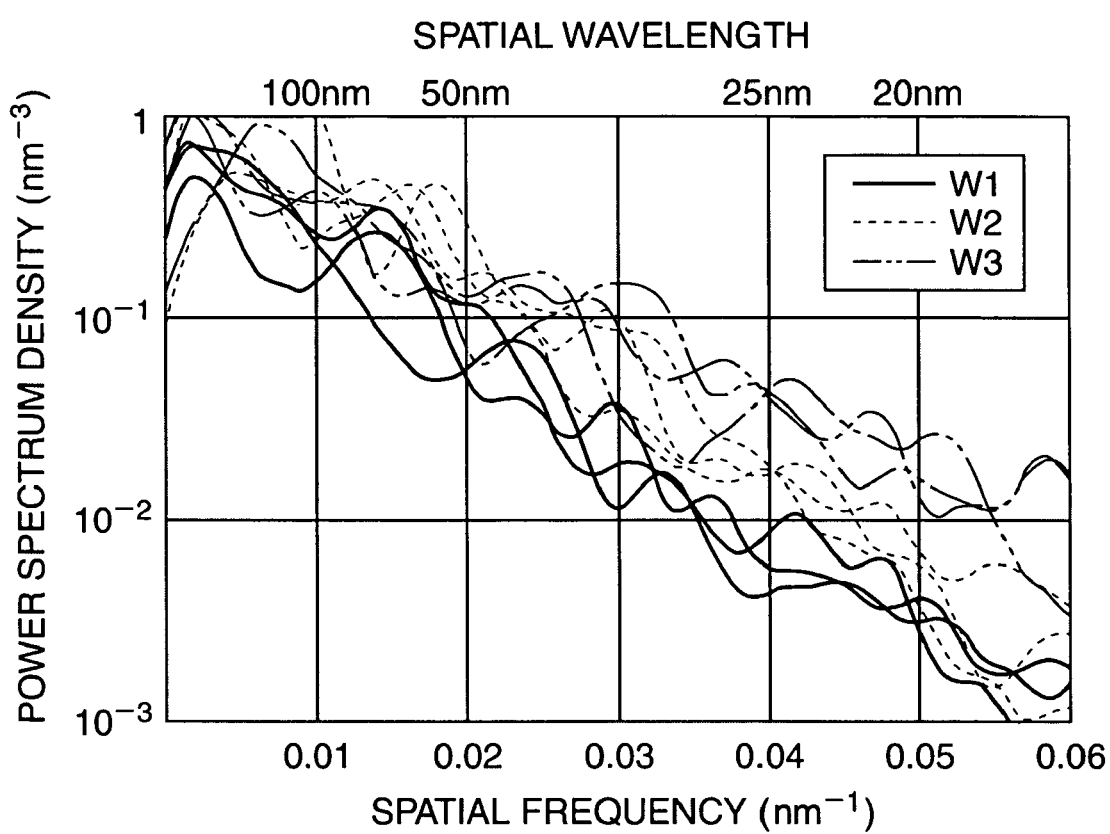
FIG. 2 is a graph showing relationship of spatial frequency and spatial wavelength, and roughness after thermal treatment.
Figure 3:
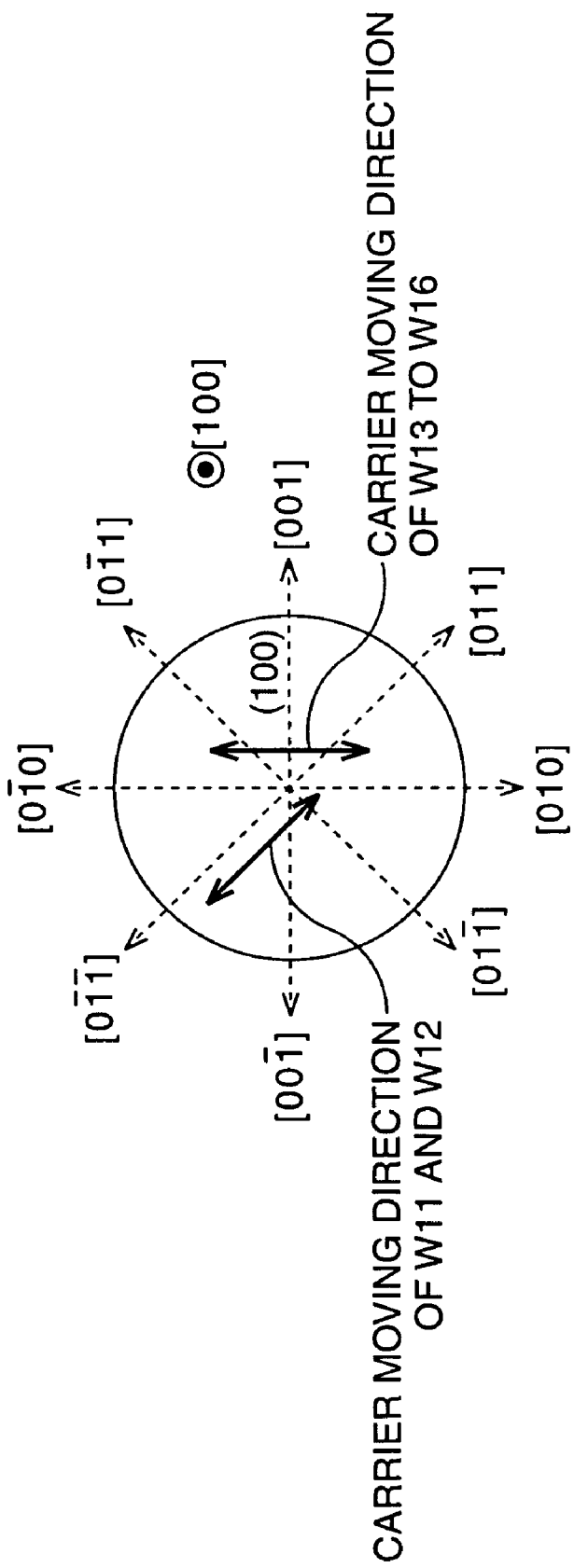
FIG. 3 is a diagram showing moving directions of carriers.

As shown in FIG. 2, the roughness of the silicon substrate W1 was smaller than the roughness of the silicon substrate W3 in the region of the spatial wavelength of 50 nm or less. The roughness of the silicon substrate W2 was smaller than the roughness of the silicon substrate W3 in the region of the spatial wavelength of 25 nm or less.

From the results of the above, on manufacture of the silicon substrate used for manufacturing a semiconductor device, it is suitable to cut a single crystal silicon substrate while giving an off-angle within ±0.2 degrees, preferably within 0.15 degrees, to the (100) plane in the [010] direction or the [001] direction, for example, then clean the silicon substrate and perform thermal treatment, and thereby reconstitute steps on the surface. By adopting such a method, the silicon substrates with low roughness can be obtained. Especially when the off-angle is 0.05 degrees or less, roughness is remarkably reduced. However, if the off-angle is made 0 degree, abnormal growth occurs when an epitaxial layer is grown. Consequently, it is desirable to avoid 0 degree.

More specifically, when the off-angle is decomposed into the component in the [001] direction and the component in the [010] direction, it is suitable to set the component in the [001] direction within ±0.2 degrees (exclude 0 degree), and in this case, it is preferable to set the component in the [010] direction within ±0.5 degrees. This is because if when the component in the [010] direction exceeds ±0.5 degree, the off-angle is too large, and it becomes difficult to obtain the characteristics of the silicon substrate with the plane orientation of the surface being in the vicinity of the (100) plane.

In order to obtain the silicon substrate with the off-angle of 0.2 degree or less being given to the (100) plane, it is suitable to slice the bulk of the single crystal silicon, which is grown in the [100] direction by, for example, the CZ method, at the inclination angle of 0.2 degrees or less.

Crystallographically, the [001] direction or the [001-] direction and the [010] direction or the [01-0] direction are equal even if they are inversed.

The inventor of the present application also conducted the experiment on what influence the degree of the off-angle of a silicon substrate has on the carrier mobility of a field effect transistor. In this experiment, after a bulk of the single crystal silicon was produced by growing the single crystal silicon in the [100] direction by the CZ method, single crystal silicon substrates W12 to W15 were cut while the off-angles as shown in the following Table 2 were given to the (100) planes, and the steps were reconstituted by the thermal treatment. The thermal treatment is different from a thermal treatment to the channel which will be described later.

After low-resistivity silicon substrates were cut while the off-angles as shown in the following Table 2 were given to the (100) plane and the steps were reconstituted by the thermal treatment, high-resistivity epitaxial layers were grown thereon, whereby epitaxial substrates W11 and W16 were produced. This thermal treatment was also different from the thermal treatment for the channel which will be described later.

However, in the values in Table 2, there is a possibility that an error exists in the range of ±0.03 degrees. For the epitaxial substrate W11 and the silicon substrate W12, each off-angle was expressed by being decomposed into the component in the [01-1-] direction and the component in the [01-1] direction, but it is possible to express it by being decomposed into the component in the [001] direction and the component in the [010] direction. In this case, the component in the [001] direction and the component in the [010] direction are also larger than 0.2 degrees.

TABLE 2

| SUB-STRATE | [001] DIRECTION OR [001-] DIRECTION COMPONENT | [010] DIRECTION OR [01-0] DIRECTION COMPONENT | [01-1-] DIRECTION OR [011] DIRECTION COMPONENT | [01-1] DIRECTION OR [011-] DIRECTION COMPONENT |
|---|---|---|---|---|
| W11 | | | 0.4° | 0.4° |
| W12 | | | 0.4° | 0.4° |
| W13 | 0.01° | 0.02° | | |
| W14 | 0.14° | 0.02° | | |
| W15 | 0.38° | 0.03° | | |
| W16 | 0.02° | 0.02° | | |

Figure 4:
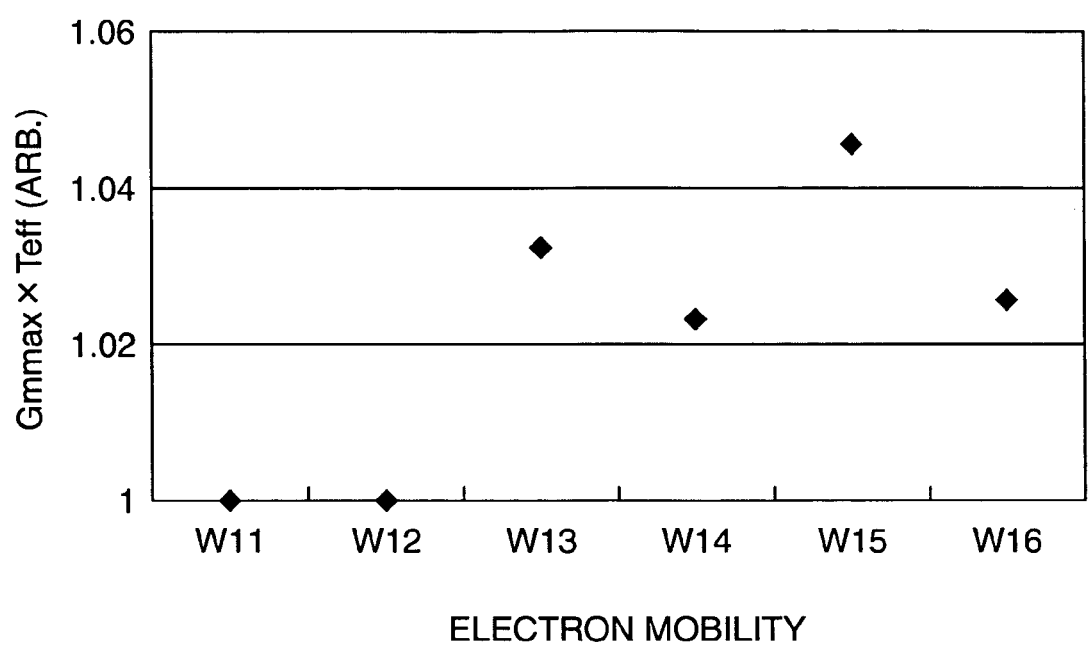
FIG. 4 is a graph showing a value of $Gm_{max} \times T_{eff}$ of each sample.

Thereafter, the MOS transistor was produced according to the method which will be described later, and $Gm_{max} \times T_{eff}$ which is an index of electron mobility of the N-channel MOS transistor was measured. On production of the MOS transistor, reconstitution of the steps by thermal treatment (hydrogen annealing) for the channel, which will be described later, was performed. In this measurement, the moving direction of the electrons (carriers) was made the [011] direction or the [01-1-] direction for the epitaxial substrate W11 and the silicon substrate W12, and the moving direction of the electrons was made the [010] direction or the [01-0] direction for the silicon substrates W13 to W15 and the epitaxial substrate W16. Namely, as for the epitaxial substrate W11 and the silicon substrate W12, the off-angle of the moving direction of the carriers was made 0.4 degrees, and as for the silicon substrates W13 to W15 and the epitaxial substrate W16, the off-angle of the moving direction of the carriers was made 0.02 to 0.03 degrees. The result of this is shown in FIG. 4. It should be noted that the values of $Gm_{max} \times T_{eff}$ of the epitaxial substrates W11 and W16 were standardized with that of the epitaxial substrate W11, and the values of $Gm_{max} \times T_{eff}$ of the silicon substrates W12 to W15 were standardized with that of the silicon substrate W12.

As shown in FIG. 4, comparing the silicon substrate W12 and the silicon substrates W13 to W15, the value of $Gm_{max} \times T_{eff}$ of each of the silicon substrates W13 to W15 was higher than that of the silicon substrate W12 by 2.3 to 4.6%. Comparing the epitaxial substrate W11 and the epitaxial substrate W16, the value of $Gm_{max} \times T_{eff}$ of the epitaxial substrate W16 was higher than that of the epitaxial substrate W11 by 2.5%.

According to the past experiment conducted by the inventor of the present application and the content of the aforesaid Non-Patent Document 1, it is obvious that the mobility of the carriers in the N-channel MOS transistor is not enhanced when the off-angle is made 0.2 to 0.5 degrees as in the prior arts.

A manufacturing method of a semiconductor device according to the embodiment of the present invention will be explained in concrete with reference to the attached drawings. In this embodiment, the high voltage transistors and the normal transistors were produced for both a P-channel MOS transistor (PMOS transistor) and an N-channel MOS transistor (NMOS transistor). FIG. 5A to FIG. 5E are sectional views showing the manufacturing method of the semiconductor device according to the embodiment of the present invention in sequence of the process steps. FIGS. 6A, 6B, 6C and 6D to FIGS. 13A, 13B, 13C and 13D are sectional views showing the manufacturing method of the semiconductor device according to the embodiment of the present invention in sequence of the process steps, continued from FIGS. 5A, 5B, 5C, 5D and 5E. It should be noted that FIG. 6A to FIG. 13A show a region in which the N-channel normal transistor is formed, FIG. 6B to FIG. 13B show a region in which N-channel high voltage transistor is formed, FIG. 6C to FIG. 13C show a region in which the P-channel normal transistor is formed, and FIG. 6D to FIG. 13D show a region in which the P-channel high voltage normal transistor is formed. In the process steps shown in FIG. 5A to FIG. 5E, the same treatment is performed for these regions, and therefore there is no discrimination.

Figure 5A:
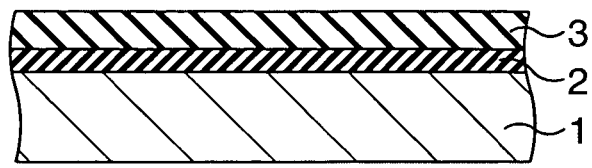
FIG. 5A to FIG. 5E are sectional views showing a manufacturing method of a semiconductor device according to an embodiment of the present invention in sequence of process steps.

In this embodiment, after cleaning a silicon substrate 1 with, for example, the diameter of 20.32 cm (8 inches), for example, RCA cleaning is performed first, a silicon oxide film ($SiO_2$ film) 2 with the film thickness of about 10 nm, and a silicon nitride film ($Si_3N_4$ film) 3 with the film thickness of about 100 to 250 nm are successively formed on the surface of the silicon substrate 1 as shown in FIG. 5A.

Here, as the silicon substrate 1, a silicon substrate which is cut from a single crystal silicon bulk grown in the [100] direction, for example, with an off-angle within ±0.15 degrees being given in, the [001] direction from the [100] direction and with an off-angle within ±0.05 degrees being given in the [010] direction from the [100] direction is used.

Figure 5B:
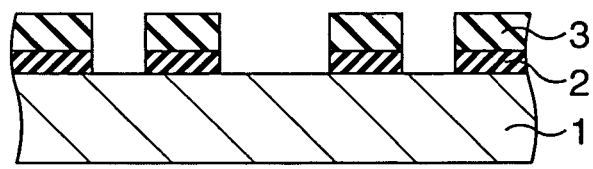

After the $Si_3N_4$ film 3 is formed, the $Si_3N_4$ film 3 and the $SiO_2$ film 2 are removed in a region in which an element isolation insulation film is to be formed, as shown in FIG. 5B.

Figure 5C:
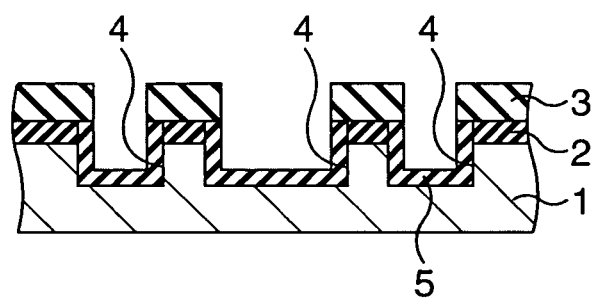

Next, as shown in FIG. 5C, a region exposed from the Si$_3$N$_4$ film 3 and the SiO$_2$ film 2 of the silicon substrate 1 is etched, whereby a shallow trench (recessed portions) 4 with, for example, the depth of about 0.2 to 0.5 μm is formed. Next, the exposed region of the silicon substrate 1 is thermally oxidized, whereby a silicon oxide film (SiO$_2$ film) 5 with, for example, the film thickness of about 10 nm is formed.

Figure 5D:
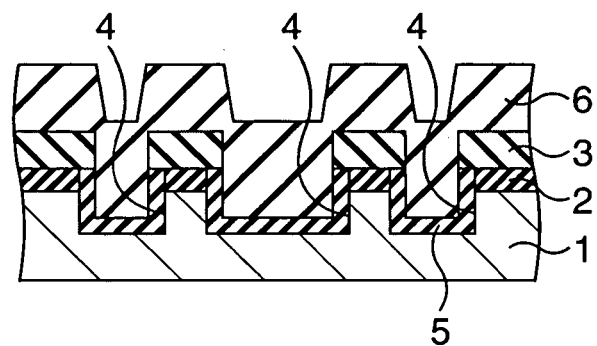

Thereafter, as shown in FIG. 5D, with use of the high density plasma (HDP: High Density Plasma) CVD (Chemical Vapor Deposition) method, a silicon oxide film (SiO$_2$ film) 6 with the film thickness of, for example, about 730 nm, which is larger than the depth of the trench 4, is formed above the silicon substrate 1, and the SiO$_2$ film 6 is completely embedded in the trench 4.

Figure 5E:
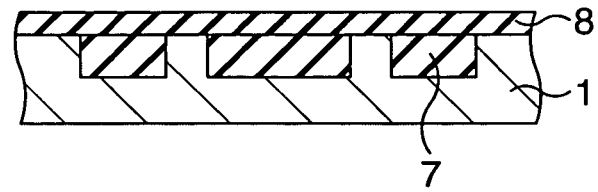
Figure 8D:
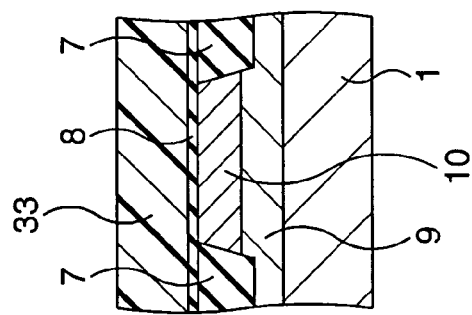
FIG. 8A to FIG. 8D are sectional views showing the manufacturing method of the semiconductor device according to the embodiment of the present invention, continued from FIG. 7A to FIG. 7D.
Figure 8C:
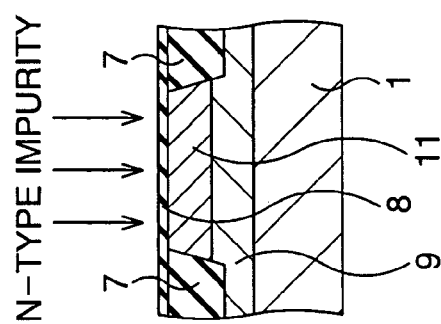
Figure 8B:
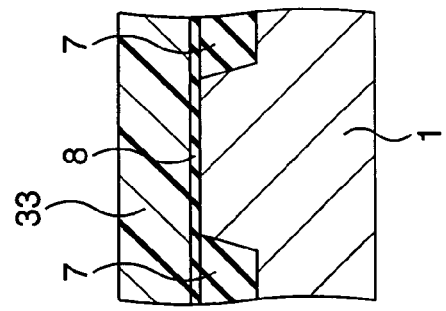
Figure 8A:
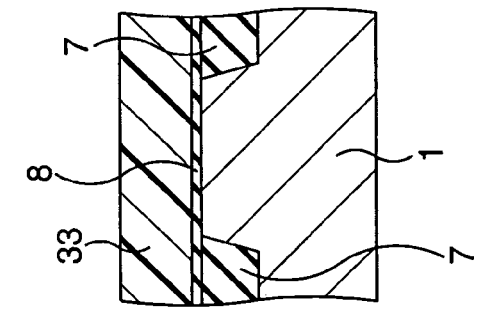
Figure 9A:
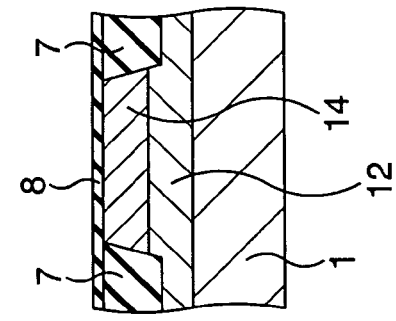
FIG. 9A to FIG. 9D are sectional views showing the manufacturing method of the semiconductor device according to the embodiment of the present invention, continued from FIG. 8A to FIG. 8D.
Figure 9B:
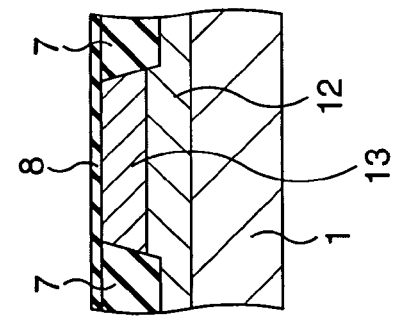
Figure 9C:
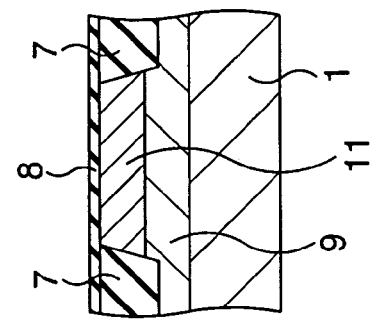
Figure 9D:
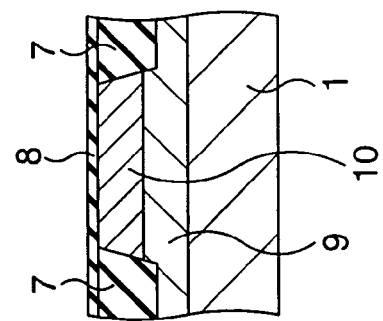

Subsequently, as shown in FIG. 5E, the SiO$_2$ film 6 is flattened by chemical mechanical polishing (CMP: Chemical Mechanical Polishing). Next, wet etching of the Si$_3$N$_4$ film 3 and the SiO$_2$ film 2 is performed by using thermal phosphoric acid. By a series of these process steps, an element isolation insulation film 7 (element isolation region) by the shallow trench isolation (STI) for element isolation, which is constructed by embedding the SiO$_2$ film 6 in the trench 4, is formed. After wet etching is performed for the Si$_3$N$_4$ film 3 and the SiO$_2$ film 2, a silicon oxide film (SiO$_2$ film) 8 with, for example, the film thickness of about 10 nm is formed. After flattening the SiO$_2$ film 6, it is preferable to make the embedded SiO$_2$ film 6 close by performing annealing at 1000° C. in the nitrogen atmosphere, for example.

Next, an entire surface is coated with photoresist, and patterning of the photoresist is performed with the photolithography technique, whereby a resist mask 31 which is provided with an opening in each of regions in which the PMOS transistors (the PMOS normal transistor and the PMOS high voltage transistor) are to be formed is formed, as shown in FIG. 6A to FIG. 6D. Next, ion implantation of N-type impurities is performed with the resist mask 31 as a mask, whereby N wells 9 are formed. Then, the resist mask 31 is removed.

Thereafter, the entire surface is coated with photoresist, and patterning of the photoresist is performed with the photolithography technique, whereby a resist mask 32 which is provided with an opening in the region where the PMOS high voltage transistor is to be formed is formed, as shown in FIG. 7A to FIG. 7D. Subsequently, ion implantation of the N-type impurities is performed with the resist mask 32 as a mask, whereby an N-type channel doping region 10 is formed on the surface of the silicon substrate 1. Then, the resist mask 32 is removed.

Next, the entire surface is coated with photoresist, and patterning of the photoresist is performed with the photolithography technique, whereby a resist mask 33 which is provided with an opening in the region where the PMOS normal transistor is to be formed is formed, as shown in FIG. 8A to FIG. 8D. Next, ion implantation of the N-type impurities is performed with the resist mask 33 as a mask, whereby an N-type channel doping region 11 is formed on the surface of the silicon substrate 1. Then, the resist mask 33 is removed.

By forming similar resist masks and performing ion implantation of P-type impurities thereafter, P wells 12 are formed in regions where the NMOS normal transistor and the NMOS high voltage transistor are to be formed. Then, a P-type channel doping region 13 is formed in the region where the PMOS high voltage transistor is to be formed, and a channel doping region 14 is formed in the region in which the PMOS normal transistor is to be formed. After the channel doping region 14 is formed, nitrogen annealing at 900° C. to 1050° C. is performed for 60 seconds or less.

Next, as shown in FIG. 10A to FIG. 10D, the SiO$_2$ film 8 is removed by using HF (hydrofluoric acid). Even after the SiO$_2$ film 8 is removed like this, a natural oxide film exists on the surface of the silicon substrate 1. Next, hydrogen annealing at 900° C. to 1050° C. is performed under a reduced pressure for 60 seconds or less. By this hydrogen annealing, the natural oxide existing on the surface of the silicon substrate 1 is etched and disappears. After the SiO$_2$ film 8 is removed and before the hydrogen annealing, chemical solution cleaning may be performed for the purpose of removal of particles, metal and the like. Such cleaning causes a chemical oxide film to be formed on the surface of the silicon substrate 1, but it disappears with the natural oxide by the hydrogen annealing.

Thereafter, a silicon oxide film (SiO$_2$ film) with the film thickness of about 6 nm, for example, is formed. Subsequently, etching is performed for the region in which the NMOS normal transistor is to be formed and the region in which the PMOS normal transistor is to be formed, whereby the silicon oxide films (thickness: about 6 nm) in these regions are selectively removed. At this point of time, the natural oxide film still exists on the silicon substrate 1.

Next, hydrogen annealing at 900° C. to 1050° C. is performed under a reduced pressure for 60 seconds or less. The natural oxide film disappears by the hydrogen annealing. Next, a silicon oxide film (SiO$_2$ film) with the film thickness of about 3 nm, for example, is formed in the region in which the NMOS normal transistor is to be formed and the region in which the PMOS normal transistor is to be formed. By these process steps, gate insulation films 15 with the thickness of about 6 nm are formed in the region in which the NMOS high voltage transistor is to be formed and the region in which the PMOS high voltage transistor is to be formed, and gate insulation films 16 with the thickness of about 3 nm is formed in the region in which the NMOS normal transistor is to be formed and the region in which the PMOS normal transistor is to be formed.

After the silicon oxide film (thickness: about 6 nm) is selectively removed and before the hydrogen annealing, chemical solution cleaning may be performed for the purpose of removal of particles, metal and the like. Such cleaning causes chemical oxide film to be formed on the surface of the silicon substrate 1, but it disappears with the natural oxide film by the hydrogen annealing.

After the gate insulation films 15 and 16 are formed, a polycrystalline silicon film is grown to 200 nm by low pressure CVD at 600° C., for example. As the polycrystalline silicon film, the one with impurities being doped may be formed. When the polycrystalline silicon film with the impurities being doped is formed, for example, phosphorus is doped in the region in which the NMOS transistor is to be formed and boron is doped in the region in which the PMOS transistor is to be formed. Patterning of the polycrystalline silicon film is performed with use of a resist mask, whereby gate electrodes 17 are formed as shown in FIG. 11A to FIG. 11D.

Next, by performing ion implantation of N-type impurities with use of a resist mask (not shown) covering the regions in which the PMOS transistors are formed, extension layers 19 are formed in the regions in which the NMOS transistors are to be formed, as shown in FIG. 12A to FIG. 12D. By performing ion implantation of P-type impurities with use of a resist mask (not shown) covering the regions in which the NMOS transistors are to be formed, extension layers 18 are formed in the regions in which the PMOS transistors are to be formed, as shown in FIG. 12A to FIG. 12D.

Ion implantation of the N-type impurities is separately performed for the region in which the NMOS normal transistor is to be formed and the region in which the NMOS high voltage transistor is formed, whereby the forming conditions may be made different from each other. Similarly, ion implantation of the P-type impurities is separately performed for the region in which the PMOS normal transistor is to be formed and the region in which the PMOS high voltage transistor is to be formed, whereby the forming conditions may be made different from each other.

Next, an SiO$_2$ film with the film thickness of about 100 nm, for example, is formed by reduced pressure CVD, and anisotropic etching is performed, whereby side wall spacers 22 are formed at sides of the gate electrodes 17.

Next, by performing ion implantation of N-type impurities with use of a resist mask (not shown) covering the regions in which the PMOS transistors are to be formed, a source/drain impurity diffusion layers 21 are formed in the regions in which the NMOS transistors are to be formed, as shown in FIG. 12A to FIG. 12D. By performing ion implantation of P-type impurities with use of a resist mask (not shown) for covering the regions in which the NMOS transistors are to be formed, a source/drain impurity diffusion layers 20 are formed in the regions in which the PMOS transistors are to be formed, as shown in FIG. 12A to FIG. 12D.

Ion implantation of the N-type impurities is performed separately for the region in which the NMOS normal transistor is to be formed and the region in which the NMOS high voltage transistor is to be formed, whereby the forming conditions may be made different from each other. Similarly, ion implantation of the P-type impurities is performed separately for the region in which the PMOS normal transistor is to be formed and the region in which the PMOS high voltage transistor is to be formed, whereby forming conditions may be made different from each other.

Thereafter, in order to activate the impurities introduced by the ion implantation, annealing at the temperature of 900 to 1050° C. for 60 seconds or less is carried out by, for example, rapid thermal anneal (RTA). It is preferable to use a rapid heating and rapid cooling device without being limited to the rapid thermal annealing.

Subsequently, a CoSi film is grown by sputtering, and annealing at about 500° C. is performed for about 30 seconds, whereby the gate electrodes 17, and the surfaces of the source/drain impurity diffusion layers 20 and 21 are transformed into silicide. Next, by performing cleaning, for example, RCA cleaning, the CoSi film which is not transformed into silicide is removed. As a result of this, a salicide structure (not shown) is obtained.

Next, as each shown in FIG. 13A to FIG. 13D, an SiO$_2$ film with, for example, the film thickness of about 1 μm is formed by the plasma CVD method, and polished by about 500 nm by CMP, whereby an interlayer insulation film 23 with a flat surface is formed. Thereafter, a plurality of contact holes are simultaneously formed in the interlayer insulation film 23. Subsequently, a barrier metal film constituted of a titanium film and a titanium nitride film is formed, and further a tungsten film is formed. By polishing the surface of the interlayer insulation film 23 by CMP, W plugs 24 are formed.

Next, a barrier metal film constituted of a titanium film and a titanium nitride film is formed, and an aluminum film is further formed. By patterning these films, a wire 25 is formed. Thereafter, an interlayer insulation film 26 on an upper layer is further formed, and a wire (not shown) on the upper layer is further formed as necessary. In this manner, the semiconductor device is completed. On forming the wire 25, it is possible to use a Cu film instead of the aluminum film.

In the aforementioned experiment for measuring the mobility of the carriers, the semiconductor device manufactured by this method with the off-angle of the silicon substrate 1 being properly set is used.

In the aforementioned embodiment, the hydrogen annealing is performed for not only the regions in which the MOS normal transistors are to be formed but also the regions in which the MOS high voltage transistors are to be formed, but the hydrogen annealing may be performed for only the regions in which the MOS normal transistors are to be formed. This is because the transistor sensitive to the surface roughness is the MOS normal transistor with a thin gate insulation film. As the gate insulation film, it is possible to use a silicon nitride film or a high dielectric film other than the thermal oxide film.

Further, in the aforementioned embodiment, the NMOS normal transistor, the NMOS high voltage transistor, the PMOS normal transistor and the PMOS high voltage transistor are formed in parallel, but only some of them may be combined, and other element may be formed also. For example, a memory cell may be formed in parallel. Further, the semiconductor elements which are formed are not limited to MOS transistors.

It is possible to use the substrate in which an epitaxial layer is formed above a silicon substrate as the aforementioned epitaxial substrates W11 and W16. In this case, on forming the semiconductor elements, the steps existing on the surface of the epitaxial layer are reconstituted, and thereafter, the semiconductor device is completed by forming the gate insulating film and the gate electrodes, and the like. Before reconstituting the steps, it is preferable to perform chemical solution cleaning for the surface of the epitaxial layer.

As the manufacturing apparatus for a semiconductor device which is capable of realizing the method as described above, it is possible to constitute the one including a substrate forming portion for forming a silicon substrate in which the normal of the surface extends in an inclined direction from the [100] direction, and a thermal treatment portion for reconstituting steps existing on the surface of the silicon substrate by thermal treatment. It should be noted that as the constitution of the substrate forming unit, it is necessary to make the [001] direction component within ±0.2 degrees (excluding 0 degree) when the angle of inclination of the normal of the silicon substrate is decomposed into the [001] direction component and the [010] direction component.

As described in detail thus far, according to the present invention, roughness on the surface of the silicon substrate is reduced, and mobility of the carriers can be enhanced. Consequently, even if the semiconductor device is further micronized, high performance can be obtained.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A manufacturing method of a semiconductor device, comprising the steps of:
   forming a silicon substrate with a normal of a surface extending in an inclined direction from a [100] direction; and
   forming a semiconductor element with a moving direction of carriers being in a [001] direction, on the surface of the silicon substrate,
   wherein when an angle of inclination of the normal is decomposed into a component in the [001] direction and a component in a [010] direction, the component in the [001] direction is made within ±0.2 degrees, and
   said step of forming the semiconductor element comprises the step of reconstituting steps existing on the surface of the silicon substrate by performing thermal treatment.

2. The manufacturing method of the semiconductor device according to claim 1, wherein the component in the [001] direction is made within ±0.15 degrees.

3. The manufacturing method of the semiconductor device according to claim 1, wherein the component in the [001] direction is made within ±0.05 degrees.

4. The manufacturing method of the semiconductor device according to claim 1, wherein the component in the [010] direction is made within ±0.5 degrees.

5. The manufacturing method of the semiconductor device according to claim 1,
   wherein in said step of forming the semiconductor element,
   the thermal treatment is performed in a hydrogen atmosphere, and
   after said step of reconstituting the steps, an insulation film is formed on the silicon substrate.

6. The manufacturing method of the semiconductor device according to claim 5, further comprising the step of performing chemical solution cleaning for the surface of the silicon substrate, before said step of performing the thermal treatment in the hydrogen atmosphere.

7. The manufacturing method of the semiconductor device according to claim 5,
   wherein in said step of performing the thermal treatment in the hydrogen atmosphere, a rapid heating and rapid cooling device is used.

8. The manufacturing method of the semiconductor device according to claim 5,
   wherein in said step of performing the thermal treatment in the hydrogen atmosphere, the thermal treatment is performed under lower pressure than normal pressure.

9. The manufacturing method of the semiconductor device according to claim 5,
   wherein said step of forming the semiconductor element comprises the step of forming a gate electrode of a MOS transistor on the insulation film.

10. The manufacturing method of the semiconductor device according to claim 9,
    wherein said step of forming the semiconductor element comprises the step of forming a source and a drain so that the moving direction of the carriers in a channel of the MOS transistor is in the [001] direction.

11. The manufacturing method of the semiconductor device according to claim 1,
    wherein said step of forming the silicon substrate comprises the steps of:
    growing a bulk of single crystal silicon in the [100] direction; and
    cutting the silicon substrate from the bulk.

12. The manufacturing method of the semiconductor device according to claim 11,
    wherein in said step of growing the bulk of the single crystal silicon, a Czochralski method is adopted.

13. The manufacturing method of the semiconductor device according to claim 1, further comprising the step of forming an element isolation region on the surface of the silicon substrate, before said step of performing the thermal treatment in the hydrogen atmosphere.

14. A manufacturing method of a semiconductor device, comprising the steps of:
    forming a silicon substrate with a normal of a surface extending in an inclined direction from a [100] direction;
    forming an epitaxial layer on the silicon substrate; and
    forming a semiconductor element with a moving direction of carriers being in a [001] direction, on a surface of the epitaxial layer,
    wherein when an angle of inclination of the normal is decomposed into a component in the [001] direction is and a component in a [010] direction, the component in the [001] direction is made within ±0.2 degrees, and
    said step of forming the semiconductor element comprises the step of reconstituting steps existing on the surface of the epitaxial layer by performing thermal treatment.

15. The manufacturing method of the semiconductor device according to claim 14, wherein the component in the [010] direction is made within ±0.15 degrees.

16. The manufacturing method of the semiconductor device according to claim 14, wherein the component in the [001] direction is made within ±0.05 degrees.

17. The manufacturing method of the semiconductor device according to claim 14, wherein the component in the [010] direction is made within ±0.5 degrees.

18. The manufacturing method of the semiconductor device according to claim 14,
    wherein in said step of forming the semiconductor element,
    the thermal treatment is performed in a hydrogen atmosphere, and
    after said step of reconstituting the steps, an insulation film is formed on the epitaxial layer.

19. The manufacturing method of the semiconductor device according to claim 18, further comprising the step of performing chemical solution cleaning for the surface of the epitaxial layer, before said step of performing the thermal treatment in the hydrogen atmosphere.

20. The manufacturing method of the semiconductor device according to claim 18,
    wherein in said step of performing the thermal treatment in the hydrogen atmosphere, a rapid heating and rapid cooling device is used.

21. The manufacturing method of the semiconductor device according to claim 18,
    wherein in said step of performing the thermal treatment in the hydrogen atmosphere, the thermal treatment is performed under lower pressure than normal pressure.

22. The manufacturing method of the semiconductor device according to claim 18,
    wherein said step of forming the semiconductor element comprises the step of forming a gate electrode of a MOS transistor on the insulation film.

23. The manufacturing method of the semiconductor device according to claim 22,
    wherein said step of forming the semiconductor element comprises the step of forming a source and a drain so that the moving direction of the carriers in a channel of the MOS transistor is in the [001] direction.

24. The manufacturing method of the semiconductor device according to claim 14,
wherein said step of forming the silicon substrate comprises the steps of:
growing a bulk of a single crystal silicon in the [100] direction; and
cutting the silicon substrate from the bulk.

25. The manufacturing method of the semiconductor device according to claim 24,
wherein in said step of growing the bulk of the single crystal silicon, a Czochralski method is adopted.

26. A manufacturing method of a semiconductor device, comprising the steps of:
forming a silicon substrate with a normal of a surface extending in an inclined direction from a [100] direction; and
forming a semiconductor element with a moving direction of carriers being in a [001]direction, on the surface of the silicon substrate,
said step of forming the semiconductor element comprises the step of reconstituting steps existing on the surface of the silicon substrate by performing thermal treatment in a hydrogen atmosphere at 950° C. to 1050° C. for 60 seconds or less,
wherein when an angle of inclination of the normal is decomposed into a component in the [001] direction and a component in a [010] direction, the component in the [001] direction is made within ±0.2 degrees,
wherein after said step of reconstituting the steps, an insulation film is formed on the silicon substrate.

27. A manufacturing method of a semiconductor device, comprising the steps of:
forming a silicon substrate with a normal of a surface extending in an inclined direction from a [100] direction;
forming an epitaxial layer on the silicon substrate; and
forming a semiconductor element with a moving direction of carriers being in a [001]direction, on a surface of the epitaxial layer,
said step of forming the semiconductor element comprises the step of reconstituting steps existing on the surface of the epitaxial layer by performing thermal treatment in a hydrogen atmosphere at 950°C. to 1050°C. for 60 seconds or less,
wherein when an angle of inclination of the normal is decomposed into a component in the [001] direction and a component in a [010] direction, the component in the [001] direction is made within ±0.2 degrees, and
wherein after said step of reconstituting the steps, an insulation film is formed on the epitaxial layer.

28. A semiconductor device comprising:
a silicon substrate with a normal of a surface extending in an inclined direction from a [100] direction the component in the [001] direction being within ±0.2 degrees when an angle of inclination of the normal is decomposed into a component in the [001] direction and a component in a [010] direction, and steps existing on the surface of the silicon substrate having been reconstituted by thermal treatment; and
a semiconductor element with a moving direction of carriers being in a direction, on the surface of the silicon substrate.

* * * * *